United States Patent [19]

Greene et al.

[11] Patent Number: 5,073,729
[45] Date of Patent: Dec. 17, 1991

[54] SEGMENTED ROUTING ARCHITECTURE

[75] Inventors: Johathan W. Greene; Abbas A. El Gamal, both of Palo Alto; Sinan Kaptanoglu, San Carlos, all of Calif.

[73] Assignee: Actel Corporation, Sunnyvale, Calif.

[21] Appl. No.: 542,722

[22] Filed: Jun. 22, 1990

[51] Int. Cl.⁵ ......................................... H03K 19/177
[52] U.S. Cl. .............................. 307/465.1; 307/303.1; 357/45
[58] Field of Search ...................... 307/443, 465, 465.1, 307/468–469, 303.1, 303.2; 357/45; 364/490–491

[56] References Cited

U.S. PATENT DOCUMENTS

| | | | |
|---|---|---|---|
| 4,161,662 | 7/1979 | Malcolm et al. | 357/45 X |
| 4,642,482 | 2/1987 | Carter | 307/465.1 X |
| 4,758,745 | 7/1988 | Elbamal et al. | 307/465 |
| 4,786,904 | 11/1988 | Graham, III et al. | 307/465 X |
| 4,870,300 | 9/1989 | Nalkaya et al. | 357/45 X |
| 4,873,459 | 10/1989 | El Gamal et al. | 307/468 X |
| 4,937,475 | 6/1990 | Rhodes et al. | 307/468 X |
| 4,992,680 | 2/1991 | Benedetti et al. | 307/465.1 X |
| 4,999,698 | 3/1991 | Okuno et al. | 357/45 |
| 5,003,200 | 3/1991 | Sakamoto | 307/465 |

FOREIGN PATENT DOCUMENTS

| | | | |
|---|---|---|---|
| 0011737 | 11/1980 | European Pat. Off. | 357/45 |
| 0137229 | 8/1983 | Japan | 357/45 M |
| 2137413 | 10/1984 | United Kingdom | 357/45 M |

OTHER PUBLICATIONS

Saigo et al., "Triple-Level Wired 24k-Gate CMOS Gate Array" *IEEE J.S.S.C.*, vol. SC-20, No. 5, Oct. 1985, pp. 1005–1010.

*Primary Examiner*—David Hudspeth
*Attorney, Agent, or Firm*—Kenneth D'Alessandro

[57] ABSTRACT

A segmented routing architecture includes three or more different interior segment lengths within all of the segmented tracks in a channel. Four or more different segment lengths of interior segments are present in a channel if the sole segment in each unsegmented track is considered, too. Two or more different segment lengths of interior segments exist within a single wiring track. Lengths of adjacent segments within a track are balanced with a ratio not exceeding about two. In any given channel, the average length of all the segments in each column is relatively low in the interior and increases substantially monotonically towards the ends of the channel.

16 Claims, 2 Drawing Sheets

SEGMENTED ROUTING ARCHITECTURE

BACKGROUND OF THE INVENTION

1. Field Of The Invention

The present invention pertains to field programmable integrated circuits. More particularly, the present invention pertains to an interconnect architecture and the segmentation of conductors within that interconnect architecture.

2. The Prior Art

Routing channels in a field programmable gate array contain predefined wiring segments of various lengths. These may be permanently connected to the inputs and outputs of the gates or other functional circuitry on the integrated circuit or may be left uncommitted for use in routing. Pairs of adjacent wiring segments within a wiring track may be joined end-to-end to form longer segments by programmable interconnect elements. Such programmable interconnect elements may also be used to join wiring segments from different channels which cross over and under one another.

In mask programmable gate arrays, one or more metal layers are programmable, so segmentation can be customized for particular design. Segmentation schemes are thus unnecessary in such arrays because it is unnecessary to predefine segment lengths and positions.

With respect to user-configurable arrays, U.S. Pat. No. 4,758,745 discloses various aspects of segment length and offset. In addition, routing architectures in products made by Actel Corporation, the assignee of the present invention, Xilinx, Inc., and other companies are known to contain various length segments of conductors in the routing architecture.

Currently available user programmable integrated circuits utilize a limited variety of wiring segment lengths since additional segment length variety makes it more difficult to design and lay out the channels in the integrated circuit in a compact area. In addition, channels with a wide variety of segment lengths require the use of more complex and time consuming routing algorithms. This requirement becomes more difficult when connection of multiple adjacent short segments to create a longer segment is contemplated.

As the size and functionality of user-configurable integrated circuits increase and become more complex, the need for optimization of conductor segmentation for efficient routing becomes more important from both the stand points o circuit speeds and efficient use of silicon area. While the prior art known to the inventors has been useful for this purpose, there exists a significant speed and area penalty resulting from the need to connect together more wiring segments, or from use of segments having longer lengths, than would be needed in an optimized architecture.

BRIEF DESCRIPTION OF THE INVENTION

In a first aspect of the present invention a segmented routing architecture includes three or more different interior segment lengths within all of the segmented tracks in a channel. In a second aspect of the present invention, four or more different segment lengths of interior wiring segments are present in an channel if the sole segment in each track is considered too. In a third aspect of the invention there are two or more different segment lengths of interior segments within a single wiring track. In a fourth aspect of the present invention, lengths of adjacent segments within a track are balanced with a ratio not exceeding about two. According to another aspect of the present invention, in any given channel, the average length of all the segments in each column is relatively low in the interior and increases substantially monotonically towards the ends of the channel.

BRIEF DESCRIPTION OF THE DRAWINGS

FIG. 4a is a schematic diagram of a second illustrative wiring channel Containing a plurality of wiring tracks and wiring segments showing various aspects of the relationships between wiring tracks and wiring segments within a wiring channel for the channel of FIG. 4a.

DETAILED DESCRIPTION OF A PREFERRED EMBODIMENT

The present invention is a user-configurable interconnect architecture in which a wiring "track" is a conceptual unit composed of one or more individual wiring "segments" or conductors which are generally co-linearly disposed with respect to one another and which are initially electrically unconnected to one another. A plurality of tracks associated with on another form a wiring "channel". Those of ordinary skill in the art will recognize that individual wiring segments may cross over or under one another causing the wiring tracks of which they are a part to "twist" around one another, but that the general direction of the tracks remain parallel to the axis of the channel.

The wiring segments of the present invention may be connected to one another and to various input and output nodes of functional circuitry on the integrated circuit to form electronic circuits. The present invention concerns preferred organizations of wiring segments into wiring tracks and wiring channels.

Figure 1:
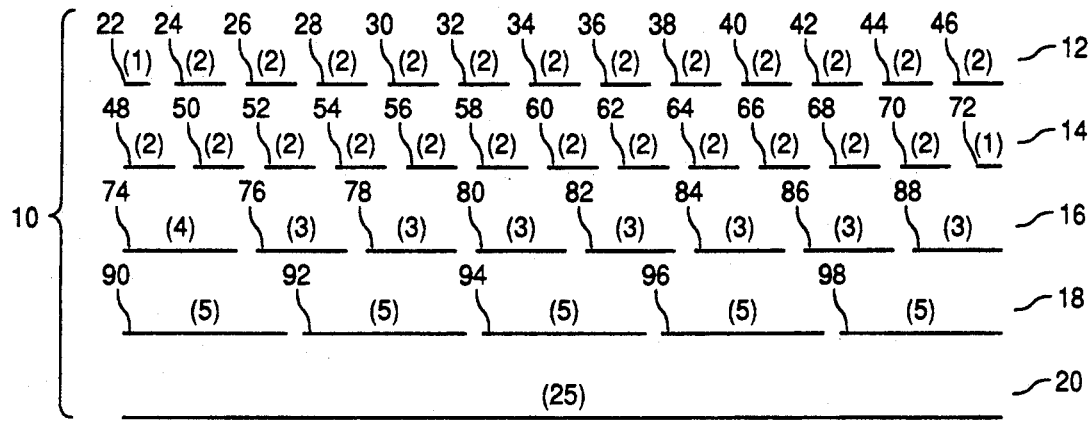
FIG. 1 is a schematic diagram of a first illustrative wiring channel containing a plurality of wiring tracks and wiring segment showing various aspects of the relationships between wiring tracks and wiring segments within a wiring channel.

Referring first to FIG. 1, a first illustrative wiring channel 10 according to the present invention is shown including five wiring tracks, indicated by reference numerals 12, 14, 16, 18, and 20. From FIG. 1, it can be further seen that the individual wiring tracks include one or more wiring segments. Thus, wiring track 12 includes wiring segments designated by reference numerals 22, 24, 26, 28, 30, 32, 34, 36, 38, 40, 42, 44, and 46. Wiring segments 22 and 46 are end segments and the remainder of the wiring segments in track 12 are internal segments. Wiring track 14 includes wiring segments 48, 50, 52, 54, 56, 58, 60, 62, 64. 66, 68, 70, and 72. Wiring segments 48 and 72 are end segments and the remainder of the wiring segments in track 14 are internal segments. Wiring track 16 includes wiring segments 74, 76, 78, 80, 82, 84, 86, and 88. Wiring segments 74 and 88 are end segments and the remainder of the wiring segments in track 16 are internal segments. Wiring track 18 includes wiring segments 90, 92, 94, 96, and 98. Wiring segments 90 and 98 are end segments and the remainder of the wiring segments in track 18 are internal segments. Finally, wiring track 20 is a non-segmented track whose single segment runs the entire track length. Those of ordinary skill in the art will recognize that one or more non-segmented tracks having lengths less than the length of the entire channel may also be used in an architecture according to the present invention.

In embodiments of the invention as implemented in silicon, programmable interconnect elements will be disposed between the ends of adjacent wiring segments within a wiring track. Such programmable elements will also be located between intersecting segments in different channels which cross over or under one another. Such elements and their locations are shown in U.S. Pat. No. 4,758,745. In addition, such programmable interconnect elements may be disposed between wiring segments in different tracks within a channel in order to provide a more potentially rich interconnection scheme.

As can be seen from examining tracks 12 and 14 of FIG. 1, the use of various length end segments allows offsetting of the ends of wiring segments in adjacent tracks in a channel. Use of such offsetting in an architecture such as that of the present invention increases the probability that a segment or segments of sufficient length and proper offset are available to route a desired connection without resort to an unnecessarily long segment.

As may be seen from the number scale superimposed above the channel in FIG. 1, the horizontal positions along each track are denoted as "columns". In a user-configurable integrated circuit such as an Actel field programmable gate array, the column units referred to herein may represent columns of logic modules or other functional circuit blocks which are to be interconnected to form electronic circuits. In general, a column might mean the largest common divisor of the segment lengths in the channel. The numbers in parenthesis above each wiring segment in FIG. 1 (and in all figures herein) refer to its length in terms of the number of columns spanned.

As can be seen from FIG. 1, the internal wiring segments in the segmented tracks within a single channel preferably have at least three lengths, in this case (2), (3), and (5) columns. The channel may have at least 4 wiring segment lengths among the interior segments in the segmented wiring tracks and the sole segments of the non-segmented wiring tracks, in this case (2), (3), (5), and (25) columns. Providing such a variety of segment lengths in the channel provides several advantages. It allows the segmentation to more closely approximate the expected distribution of connections of a wide range of individual circuit designs. The advantages include a higher likelihood of successful routing, with channels having a small area. Furthermore, the speed of the circuit is optimized since the segment(s) used to route a connection are less likely to be much longer than the length of a wire which would be needed to route the connection in a conventional gate array. Also, this tends to reduce the number of programmable interconnect elements which are needed to make the connection. Thus, in later generations of user configurable integrated circuits, the number of different internal wiring segment lengths in a single channel will need to be at least about a dozen. Furthermore, in such circuits, the number of different wiring segment lengths in a single channel including non-segmented tracks will need to be larger than about 11. In addition, if it is assumed that multiple adjacent segments in a single track may be connected together to form a larger segment, the number of different wiring segment lengths in a single track may need to be larger than about 4.

The importance of using a wide variety of segment lengths has recently been established by the inventors. Experiments show that, for typical connection distributions, channels with a wide variety of segment lengths according to the present invention can approximate the efficiency of a conventional mask programmed channel. This is especially true when two or more segments may be connected end-to-end by programmable interconnect elements to form a larger segment. This is detailed in the paper "Segmented Channel Routing" to be published in the proceedings of the 1990 ACM/IEEE Design Automation Conference, expressly incorporated herein by reference. The inventors have also established by probabilistic analysis that channels according to the present invention can be designed to be capable of handing arbitrarily large sets of connections using an area within a small constant factor of that required by a conventional mask programmed channel. This is detailed in the preprint "Segmented Channel Routing Is Nearly As Efficient As Channel Routing (and Just As Hard)", which is expressly incorporated herein by reference.

Figure 2:
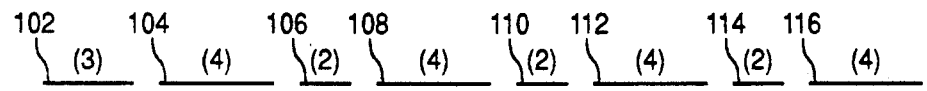
FIGS. 2 and 3 are schematic diagrams of illustrative wiring tracks useful in the user-configurable interconnect architecture according to the present invention illustrating the relationship between wiring segment sizes within a single track according to several aspects of the present invention.

Referring now to FIG. 2, an illustrative wiring track 100 is shown comprised of segments indicated by reference numerals 102, 104, 106, 108, 110, 112, 114, and 116. Wiring segments 102 and 116 are end segments and the remainder of the wiring segments in track 100 are internal segments.

Figure 3:
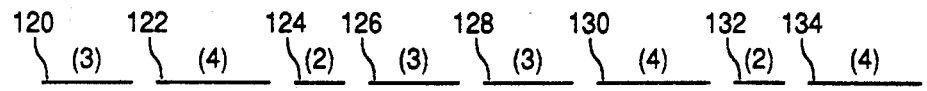

Referring now to FIG. 3, an illustrative wiring track 118 is shown comprised of segments indicated by reference numerals 120, 122, 124, 126, 128, 130, 132, and 134. Wiring segments 120 and 134 are end segments and the remainder of the wiring segments in track 118 are internal segments.

Together, FIGS. 2 and 3 illustrate other aspects of the present invention. First, these figures illustrate the use of two or more interior segment lengths in a single wiring track. In addition, the embodiments of FIGS. 2 and 3 illustrate an important characteristic of the segment lengths. As illustrated by FIGS. 2 and 3, the lengths of the wiring segments in a single track should be balanced such that the ratio of adjacent segment lengths does not exceed about 2. Thus, in FIG. 2, the lengths of pairs of adjacent segments, i.e, segments 102 and 104, 104 and 106, 106 and 108, etc., (lengths of (3) and (4), (4) and (2), (2) and (4) columns respectively) does not exceed 2. In FIG. 3, the lengths of pairs of adjacent segments 120 and 122, 122 and 124, 124 and 126, etc. (lengths of (3) and (4), (4) and (2), (2) and (3) columns respectively) does not exceed 2.

By maintaining this limit on the ratio of adjacent segment lengths, the likelihood is increased that a connection can be routed using two or more segments connected end-to-end by programmable elements with a small number of segments having a small total length.

Figure 4A:
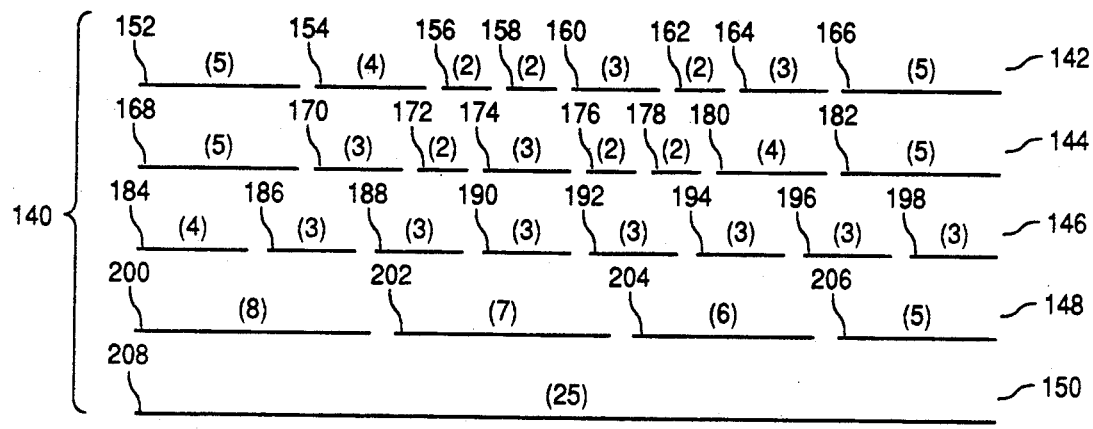

Referring now to FIG. 4a, a second illustrative wiring channel 140 according to the present invention is shown including five wiring tracks, indicated by reference numerals 142, 144, 146, 148, and 150. From FIG. 4a, it can be further seen that the individual wiring tracks include one or more wiring segments. Thus, wiring track 142 includes wiring segments designated by reference numerals 152, 154, 156, 158, 160, 162, 164, and 166. Wiring segments 152 and 166 are end segments and the remainder of the wiring segments in track 142 are internal segments. Wiring track 144 includes wiring segments !68, 170, 172, 174, 176, 178, 180, and 182. Wiring segments 168 and 182 are end segments and the remainder of the wiring segments in track !44 are internal segments. Wiring track 146 includes wiring segments 184, 186, 188, 190, 192, 194, 196, and 198. Wiring segments 184 and 198 are end segments and the remainder of the wiring segments in track 146 are internal segments. Wiring track 148 includes wiring segments 200, 202, 204, and 206. Wiring segments 200 and 206 are end segments and the remainder of the wiring segments in track 148 are internal segments. Finally, wiring track 150 is a non-segmented track whose single segment runs the entire track length.

Figure 4B:
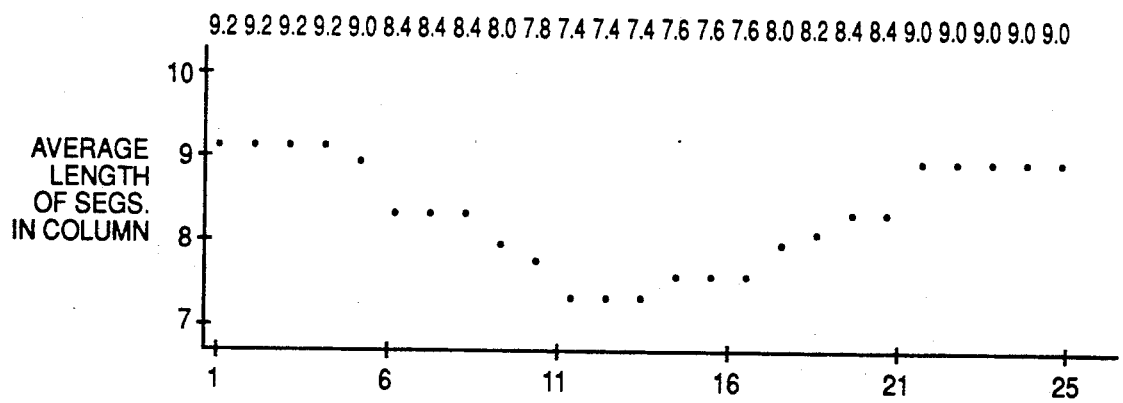
FIG. 4b is a graph showing the average length of all of the segments in a column relative to the position of the column.

In FIG. 4b, the average length of all of the segments in a given column position in a channel is plotted as a function of the position of the column. As can be seen from FIG. 4b, the average length of all the segments in each column is relatively low in the center and increases substantially monotonically towards the ends of the channel. Channels segmented according to this aspect of the invention tend to allow a higher likelihood of successful routing and better speed.

While a presently-preferred embodiment of the invention ha been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein the lengths of the wiring segments in an individual wiring ,track are balanced such that the ratio of the lengths of adjacent ones of said wiring segments does not exceed about 2.

2. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein the average length of all of said wiring segments in each column substantially monotonically increases from the center towards the ends of said channels.

3. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are at least twelve different interior wiring segment lengths within all of the segmented wiring tracks in any wiring channel.

4. The user-configuration interconnect architecture of claim 3 further including at least one non-segmented wiring track within at least one wiring channel.

5. A user-configurable interconnect architecture employable in user-configurable integrated circuits having individual wiring segments organized into wiring tracks and a plurality of said wiring tracks organized into a wiring channel the lengths of said wiring tracks being measurable in column units where the unit length of a column is equal to the largest common divisor of the lengths of said wiring segments, wherein there are at least five diff®rent interior Wiring segment lengths within a single one of said segmented wiring tracks.

6. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are at least three different interior wiring segment lengths within all of the segmented wiring tracks in an wiring channel, and wherein the average length of all of said wiring segments in each column substantially monotonically increases from the center towards the ends of said wiring channels.

7. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are at least three different interior wiring segment lengths within all of the segmented wiring tracks in any wiring channel, wherein there are at least two different interior wiring segment lengths within a single one of said segmented wiring tracks, and wherein the average length of all of said wiring segments in each column substantially monotonically increases from the center towards the ends of said wiring channels.

8. The user-configuration interconnect architecture of claim 1 wherein the average length of all of said wiring segments in each column substantially monotonically increases from the center towards the ends of said wiring channels.

9. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are at least three different interior wiring segment lengths within all of the segmented wiring tracks in an wiring channel, and the lengths of the wiring segments in an individual wiring track are balanced such that the ratio of the lengths of adjacent ones of said wiring segments does not exceed about 2.

10. The user-configurable interconnect architecture of claim 9 wherein the average length of all of said wiring segments in each column substantially monotonically increases from the center towards the ends of said wiring channels.

11. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are at least two different interior wiring segment lengths within a single one of said segmented wiring tracks and the lengths of the wiring segments in an individual wiring track are balanced such that the ratio of the lengths of adjacent ones of said wiring segments does not exceed about 2.

12. The user-configurable interconnect architecture of claim 11 wherein the average length of all of said wiring segments in each column substantially monotonically increases from the center towards the ends of said wiring channels.

13. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are at least three different interior wiring segment lengths within all of the segmented wiring tracks in an wiring channel, there are at least two different interior wiring segment lengths within a single one of said segmented wiring tracks, and the lengths of the wiring segments in an individual wiring track are balanced such that the ratio of the lengths of adjacent ones of said wiring segments does not exceed about 2.

14. The user-configurable interconnect architecture of claim 13 wherein the average length of all of said wiring segments in each column substantially monotonically increases from the center towards the ends of said wiring channels.

15. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are at least two different interior wiring segment lengths within a single one of said segmented wiring tracks, and wherein the average length of all of said wiring segments in each column substantially monotonically increases from the center towards the ends of said wiring channels.

16. A user-configurable interconnect architecture employable in user-configurable integrated circuits having individual wiring segments organized into wiring tracks and a plurality of said wiring tracks organized into a wiring channel, the lengths of said wiring tracks being measurable in column units where the unit length of a column is equal to the largest common divisor of the lengths of said wiring segments, wherein there are more than twelve different wiring segment lengths of non-end segments within all of the wiring tracks in any wiring channel.

* * * * *